(12) United States Patent
Chiu

(10) Patent No.: US 7,047,469 B2
(45) Date of Patent: May 16, 2006

(54) METHOD FOR AUTOMATICALLY SEARCHING FOR AND SORTING FAILURE SIGNATURES OF WAFERS

(75) Inventor: Kang-Mien Chiu, Hsinchu-Taiwan (TW)

(73) Assignee: Promos Technologies Inc., Hsinchu (TW)

( * ) Notice: Subject to any disclaimer, the term of this patent is extended or adjusted under 35 U.S.C. 154(b) by 1068 days.

(21) Appl. No.: 09/808,989

(22) Filed: Mar. 16, 2001

(65) Prior Publication Data
US 2002/0053054 A1 May 2, 2002

(30) Foreign Application Priority Data
Sep. 7, 2000 (TW) .................................... 89118284 A

(51) Int. Cl.
*G01R 31/28* (2006.01)

(52) U.S. Cl. ........................ 714/732; 700/110
(58) Field of Classification Search ............... 714/732, 714/737, 724, 738; 365/201; 700/110; 702/35, 702/36, 84
See application file for complete search history.

(56) References Cited
U.S. PATENT DOCUMENTS
5,475,695 A * 12/1995 Caywood et al. ........... 714/737
5,652,754 A * 7/1997 Pizzica ....................... 714/736
5,828,825 A * 10/1998 Eskandari et al. ............ 714/27
6,154,714 A * 11/2000 Lepejian ...................... 702/118
6,507,800 B1 * 1/2003 Sheu .......................... 702/117
6,580,960 B1 * 6/2003 Nicholson ..................... 716/4

FOREIGN PATENT DOCUMENTS
JP    06-112101    4/1994
JP    11-264797    9/1999
JP    2000-077496  3/2000

OTHER PUBLICATIONS
Japanese Office Action Dated Dec. 2, 2003.

* cited by examiner

Primary Examiner—Guy J. Lamarre
(74) Attorney, Agent, or Firm—Nixon Peabody LLP; Donald R. Studebaker

(57) ABSTRACT

A method of searching for and sorting failure signatures of wafers is provided. First, a failure signature database is built up for recording a plurality of failure signature data, wherein each failure signature data includes a failure signature, a location field for the faulty dies, a failure mode, a position dependence information and a dependent signature. Next, a selected wafer is tested and a test result is generated. Last, a comparison result is generated by an automatic comparing device, wherein the comparison result includes a hit or a miss. When the comparison result is a hit, the comparison result further includes a hit ratio. And as the hit ratio exceeds a predetermined value, the step of comparing the dependent signature of the failure signature database is skipped.

10 Claims, 5 Drawing Sheets

Failure signature: GC BUMP
Failure mode: Ya or Ydcabia
Die number: 0214, 0213, 0212...
Dependent signature: 4 clock, 8 clock
Position dependence: Y

— 41

Failure signature: Ya scrach
Failure mode: Ya
Die number: 0329, 0330, 0331...
Dependent signature: P1, P2
Position dependence: N

— 42

Failure signature: 4 clock
Failure mode: Ydcabia
Die number: 0723, 0726, 0745...
Position dependence: Y

— 43

Failure signature: DC CLAMP
Failure mode: Ya
Die number: 1207, 1208, 1209...
Position dependence: Y

METHOD FOR AUTOMATICALLY SEARCHING FOR AND SORTING FAILURE SIGNATURES OF WAFERS

FIELD OF THE INVENTION

The present invention relates to a method for automatically searching for failure signatures of wafers. More particularly, the present invention relates to a method used in the fabrication processes of semiconductors to automatically search for and sort failure signatures of wafers for further debugging and analyzing.

BACKGROUND OF THE INVENTION

Generally speaking, manufacturing processes of semiconductors include a wafer fabrication process, a wafer probing process, a wafer packaging process, and a wafer testing process. During the wafer fabrication process, a plurality of individual dies are formed on a single wafer. The electrical property of each die is tested by a testing device in the wafer probing process. After the wafer probing process is performed, each individual faulty die is found and typically marked with a color ink dot to be distinguished from a good die. However, the method of marking each faulty die with the color ink dot has many shortcomings. For example, the color ink may chemically damage or smudge other good dies, so that they are difficult to be distinguished from faulty dies. For this reason, many alternatives to record the result of the wafer test information have been developed to eliminate the aforementioned shortcomings. One typical method uses a computer to generate a wafer map, which records the result of the wafer test information. Typically, the wafer map shows the location of each faulty die and the type of manufacturing defects of the faulty die. The information may be printed in paper or transmitted to a monitor for further analyzing by a yield-analyzing engineer.

A conventional wafer map 10 generated by a computer as shown in FIG. 1 shows the yield condition with respect to a plurality of dies 12 on a single wafer 11 and the locations of the plurality of faulty dies 13 indicated by a variety of signals and colors.

Conventional techniques rely on an "eyeball" method, in which an experienced yield-analyzing engineer should manually examine each failure signature on wafer maps generated by a computer, and then make his best judgment to sort the wafers by the failure signatures. After sorting, the causes of the faulty dies on wafers may be further analyzed by an analytic device.

However, this conventional method has many limitations in practical applications. First, the yield-analyzing engineer must spend much time on examining each wafer map. Second, the yield-analyzing engineer must have sufficient knowledge and experiences about failure signatures of wafer maps so as to be qualified to do this task. Moreover, the further analyses of causes of faults are not done until the yield-analyzing engineer sorts the failure signatures of new coming wafers. Additionally, the manually operated method may have unavoidable artificial negligence.

In view of the foregoing, it is desirable to provide a method of automatically searching for the failure signatures of wafers to avoid the aforementioned shortcomings of the prior art.

SUMMARY OF THE INVENTION

One of the purposes of the present invention is to save the yield-analyzing engineer's time on sorting failure signatures of wafers to avoid negligence. In order to accomplish this purpose, the present invention provides a method for automatically searching for and sorting failure signatures of wafers. In accordance with the present invention, a failure signature database including a plurality of failure signature data is built up first. The data of each failure signature include a location, a failure mode, a position dependency information and a failure signature. Wherein the location of each faulty die is represented by the number of each die in an exemplary embodiment, and the position dependency information shows whether the failure signature is correlated with the location of the faulty dies. Next, at least one selected wafer is tested by a testing device, and then the test result including the locations of faulty dies and their failure modes is generated for each selected wafer. Then, compare the test result of each selected wafer with each failure signature data of the failure signature database by an automatic comparing device. If the record of the position dependency information is Y (yes), each test result is compared with the failure modes and locations of the faulty dies. Whereas if the record of the position dependency information is N (no), each test result is compared with the failure modes and the amount of the faulty dies. After the comparison, a comparison result including a wafer number, a failure signature and a hit ratio is generated for each test result. Finally, a threshold is selected to be compared one by one with the hit ratio, so that the wafer numbers and the failure signatures of the corresponding wafers, which have hit ratios greater than or equal to the threshold, can be easily picked out.

Another purpose of the present invention is to analyze the root cause of the yield failure whenever the wafer numbers and the failure signatures are picked out. To achieve this purpose, the present invention further inputs the wafer numbers and the failure signatures into an analytic device for further analysis.

In an exemplary embodiment according to the present invention, a failure signature data may further include a dependent signature with respect to the failure signature. The dependent signature is originally a failure signature recorded in the failure signature database. However, because its location and failure mode is completely included in another failure signature data, it is denoted a dependent signature of the including failure signature data. Therefore, when the automatic comparing device compares the test result one by one with the failure signature data with the hit ratio exceeding the yield-analyzing engineer's predetermined value, the dependent signature can be skipped to avoid re-comparison.

In another exemplary embodiment according to the present invention, after the automatic comparing device has compared the test result with each failure signature data, if the test result has not matched any failure signature data in the failure signature database, a result representing the undefined signature is generated. Wherein the result includes the wafer number of the selected wafer, an unknown signature defined by the automatic comparing device, and a description with respect to the unknown signature. Moreover, the unknown signature and the description with respect to the unknown signature are inputted into an analytic device for further analysis. The yield-analyzing engineer then further defines the unknown signature and inputs it into the failure signature database as a new failure signature.

Moreover, a more complete understanding of the advantages and spirits of the present invention may be derived by referring to the detailed description when considered in connection with the following illustrative figures.

BRIEF DESCRIPTION OF THE DRAWING FIGURES

FIG. 4 shows a failure signature database in accordance with the present invention.

DETAILED DESCRIPTION OF THE INVENTION

Figure 2:
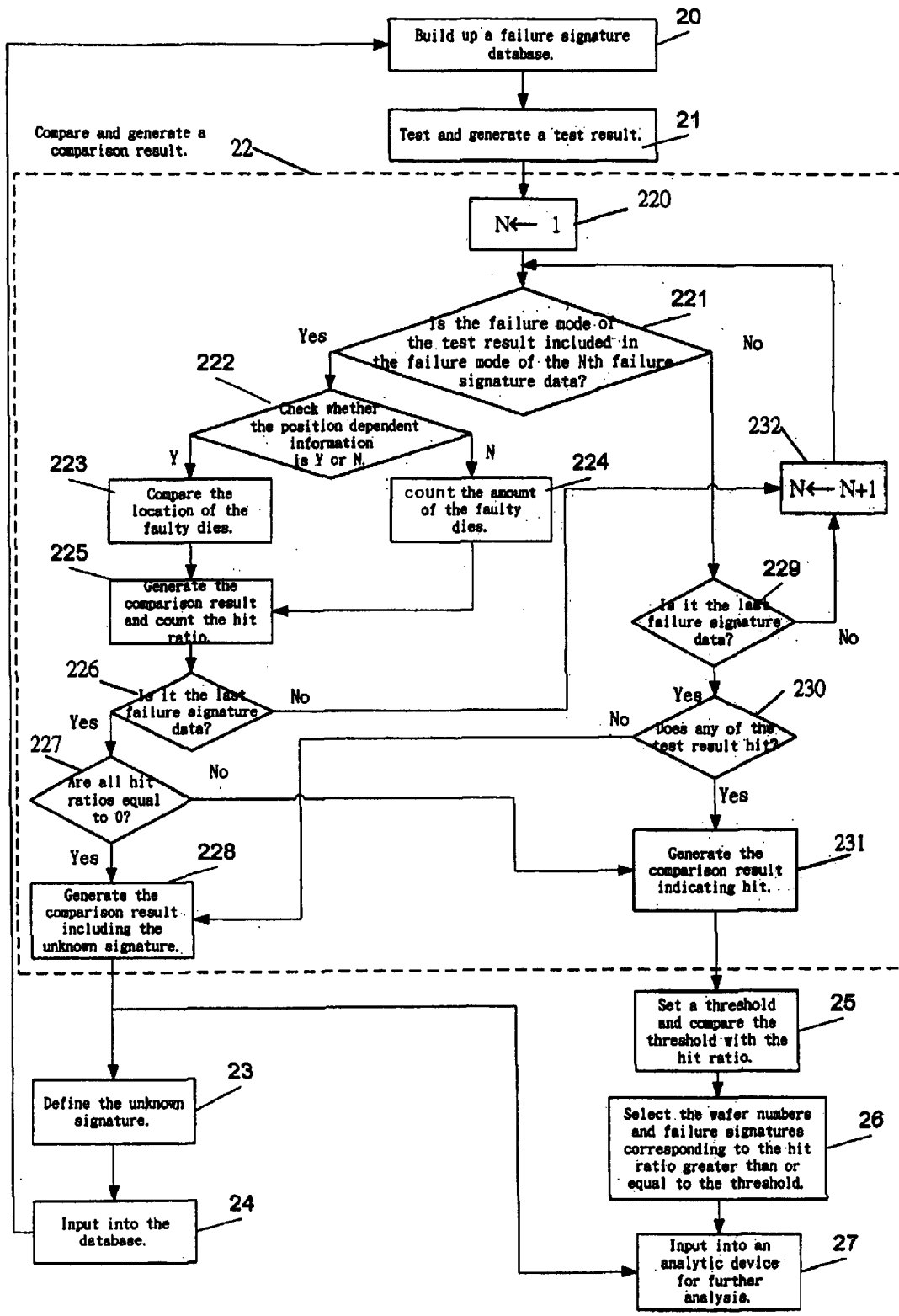
FIG. 2 shows a flowchart of a method in accordance with the present invention.

Please refer to FIG. 2. The present invention first builds up a failure signature database in step 20. In an exemplary embodiment, the database may be built up in a server. Referring now to FIG. 4, the failure signature database records all defined failure signature data, wherein the failure signature data is determined based on the wafer maps. The data of each failure signature include a failure signature, at least one failure mode, a location field noting the faulty dies, the position dependent information and the selective dependent signature for automatically comparing by the automatic comparing device, as mentioned behind. Preferably, the failure signature data of the present invention records typically known information of the wafer maps, but it is not necessarily illustrated in a pattern form. Moreover, the failure mode is a characteristic parameter symbolizing the cause of the failure of the wafer, the location field may be represented by the serial numbers of the faulty dies, and the position dependent information shows whether the failure signature is related to the position of the faulty die. When the failure signature is related to the faulty die position, the record of the position dependent information is Y (yes), while as the failure signature is not related to the faulty die position, the record of the position dependent information is N (no).

Figure 1:
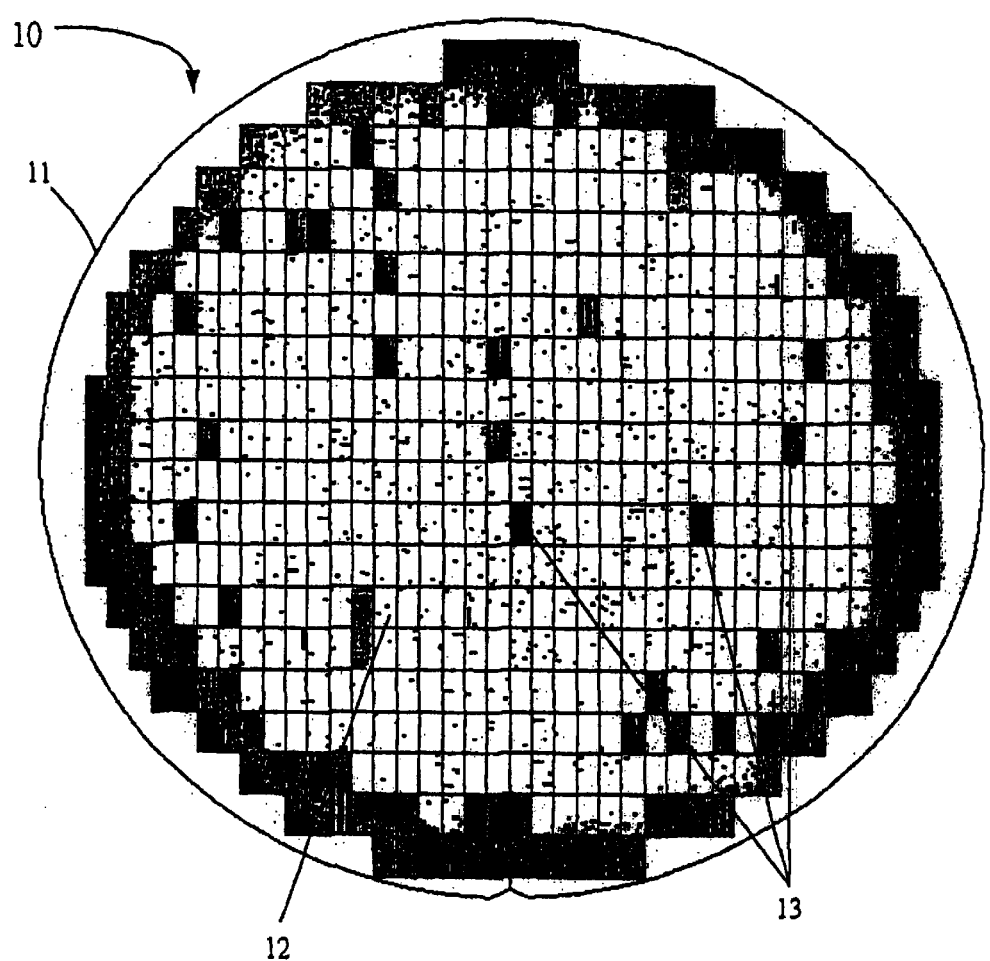
FIG. 1 shows a wafer map generated by a computer.

In step 21, at least one selected wafer is tested by a testing device, wherein each selected wafer has a wafer number. The testing device generates a test result for each selected wafer, wherein each test result includes the location and failure mode of each faulty die on the selected wafer. This technique is similar to the prior art and is understood by people skilled in the art, so it is unnecessary to discuss in detail hereinafter. However, the prior art must translate the test result into a wafer map 10 (as shown in FIG. 1) for being reviewed by a yield-analyzing engineer with eyes, while the present invention does not need to do so.

After testing, in step 22 (indicated with a dotted line), each test result of the selected wafers is compared with each failure signature data of the failure signature database by the automatic comparing device, and then a comparison result is generated. Wherein the automatic comparing device, in an exemplary embodiment, is a hardware device, such as a computer, with a comparing program. Moreover, the comparing program is able to compare the location, compare the failure mode match degree, and count the faulty dies.

In step 22, first the present invention sets N=1 in step 220, and then in step 221 the present invention compares the test result with the Nth failure signature data to check whether the failure mode of the test result is included in the failure mode of the Nth failure signature. If the answer is yes in step 221, then step 222 is performed; if it is no in step 221, then step 229 is performed.

In step 222, the present invention checks whether the position dependent information of the Nth failure signature data is Y or N.

If the position dependent information is Y in 222, the automatic comparing device compares the location of the faulty die of the test result with the location field of the faulty die of the Nth failure signature data in step 223, and generate n, noting the total number of the faulty dies whose locations match the location field in the database, wherein n is an integer greater than or equal to 0.

If the position dependent information is N in step 222, in step 224 the automatic comparing device simply counts the amount of the faulty dies of the test result to be designated as n, wherein n is an integer greater than or equal to 0.

After aforementioned step 223 or 224 is performed, the present inven in a comparison result in step 225, and counts the hit ratio of the test result to the Nth failure signature data. Wherein the comparison result includes the wafer number of each selected wafer, the failure signature of the Nth failure signature data, and the hit ratio. The hit ratio is the ratio of n to the amount of faulty dies of the Nth failure signature data (indicated as M); i.e. the hit ratio is n/M.

Further in step 226, if the last failure signature data has been compared, the step 227 is performed; if the last failure signature data has not been compared, the step 232 is performed. In step 232 the invention sets N=N+1, and then comes back to step 221 to compare the (N+1)th failure signature data.

In step 227, if the hit ratio of the test result to every Nth failure signature data is 0, a comparison result representing that the test result is an unknown signature is generated in step 228. The comparison result includes the wafer number of the selected wafer, an unknown signature, and a description with the unknown signature. Wherein the unknown signature is defined by the automatic comparing device, and, in an exemplary embodiment of the present invention, the unknown signature is represented by OTHER_N (N is a natural number). When the OTHER_N is present in the comparison result, it indicates that the failure signature has neither been defined nor been inputted into the failure signature database.

In step 227, if the hit ratio of the test result to every Nth failure signature data is 0, a comparison result representing that the test result is an unknown signature is generated in step 228. The comparison result includes the wafer number of the selected wafer, an unknown signature, and a description with the unknown signature. Wherein the unknown signature is defined by the automatic comparing device, and, in an exemplary embodiment of the present invention, the unknown signature is represented by OTHER_N (N is a nature number). When the OTHER_N is present in the comparison result, it indicates that the failure signature has neither been defined nor been inputted into the failure signature database.

As mentioned above, if the answer is no in step 221, step 229 is performed. In step 229, if the last failure signature data is compared, step 230 is performed; if the last failure signature data is not compared, step 232 is performed. Moreover, in step 232, the present invention sets N=N+1, and then comes back to step 221 to compare the (N+1)th failure signature data.

In step 230, if the failure mode of the test result is not hit with all of the N failure signature data, i.e., the failure mode of the test result is not included in any failure signature data, then a comparison result indicating that the test result is an unknown signature is generated in step 228. Otherwise, a comparison result indicating that the test result is hit with the failure signature data is generated in step 231.

After the comparison in step 22 is done and a comparison result is generated, if there is any hit asserted in the comparison result (step 231), a threshold is set in step 25 for comparing the threshold with the hit ratio of the comparison result. Wherein in an exemplary embodiment, the threshold is set by a yield-analyzing engineer based on his experience.

Further in step 26, the present invention picks the wafer numbers and failure signatures of the wafers with hit ratios greater than or equal to the threshold. Moreover in step 27, the present invention inputs all the picked wafer numbers and failure signatures into an analytic device for further analyzing the root cause of failure. The analytic device, in an exemplary embodiment, is a commonality study tool, which can analyze the root cause of failure wafers based on the wafer numbers and failure signatures provided by the present invention.

In an exemplary embodiment, the present invention may further include one or more duplicate steps to select the wafer numbers and the failure signatures corresponding to a variety of thresholds. The one or more duplicate steps include selecting another threshold every time, comparing the hit ratio of each selected wafer, selecting the wafer numbers and failure signatures of the wafers with hit ratios greater than or equal to the threshold, and inputting all the picked wafer numbers and failure signatures into an analytic device for further analyzing the root cause of failure.

Furthermore, the failure signature data according to the present invention may selectively record a dependent signature corresponding to the failure signature. Wherein the dependent signature is originally a failure signature, but the location field and failure mode of the failure signature data corresponding to the dependent signature is completely included in another failure signature data corresponding to another failure signature. Therefore, the failure signature is acted as a dependent signature to the including failure signature. When the automatic comparing device compares the test result one by one with the failure signature data, if the dependent signature is encountered and the hit ratio of the failure signature including the dependent signature exceeds the yield-analyzing engineer's predetermined value in step 225, the dependent failure signature data is skipped to avoid unnecessary re-comparison and wasting of time. In an exemplary embodiment, the failure signature data including the dependent signature (such as the failure signature data 41 and 42 as shown in FIG. 4) is compared prior to the failure signature data whose failure signature is a dependent signature (such as the failure signature data 43). It ensures that the failure signature data 41 and 42 including the dependent signature is compared first. Moreover, the predetermined value is preferably set to be 80%.

Figure 3:
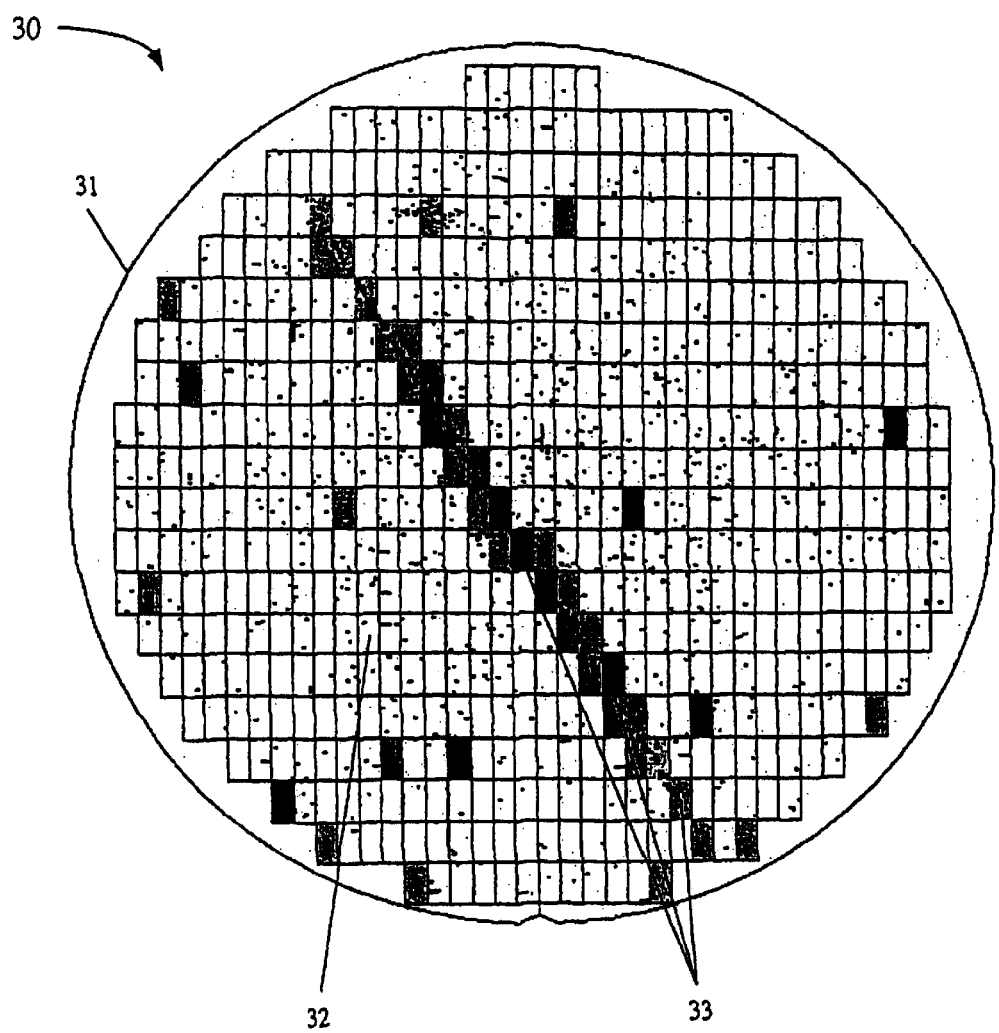
FIG. 3 shows a wafer map including an unknown signature.

In aforementioned step 228, if the test result is not defined by the failure signature database, the comparison result including the wafer number of the selected wafer, an unknown signature and a description related to the unknown signature is generated. Wherein in an exemplary embodiment of the present invention, OTHER_N represents the unknown signature. Referring to FIG. 3, a wafer map 30 including an unknown signature shows the yield condition with respect to a plurality of dies 32 on a single wafer 31 and each location of the plurality of faulty dies 33 with a variety of signals and colors. The failure signature of the wafer map 30 is that it has a plurality of continuous faulty dies, and the failure signature is not defined by the failure signature database. As the comparison result appears as OTHER_N, the OTHER_N with its description is inputted into the analytic device for further analysis in step 27. And after the failure signature is defined in step 23, it may be inputted into the database in step 24 as a new failure signature data, which can be built up in step 20. It can be expected that as the contents of the database become perfect, the appearence of OTHER_N will be rapidly reduced, and the application of the present invention will be greatly enhanced.

Exemplary Embodiments

FIG. 4 shows the failure signature database built in step 20 according to the present invention. The failure signature database includes a plurality of failure signature data 41, 42, 43, and 44 etc. For example, with referring to the wafer map 10 as shown in FIG. 1, the failure signature data includes:

Failure signature: GC BUMP

Failure mode: Ya or Ydcabia

Die number: 0214, 0213, and 0212 . . .

Dependent signature: 4 clock, 8 clock

Position dependence: Y

Figure 5:
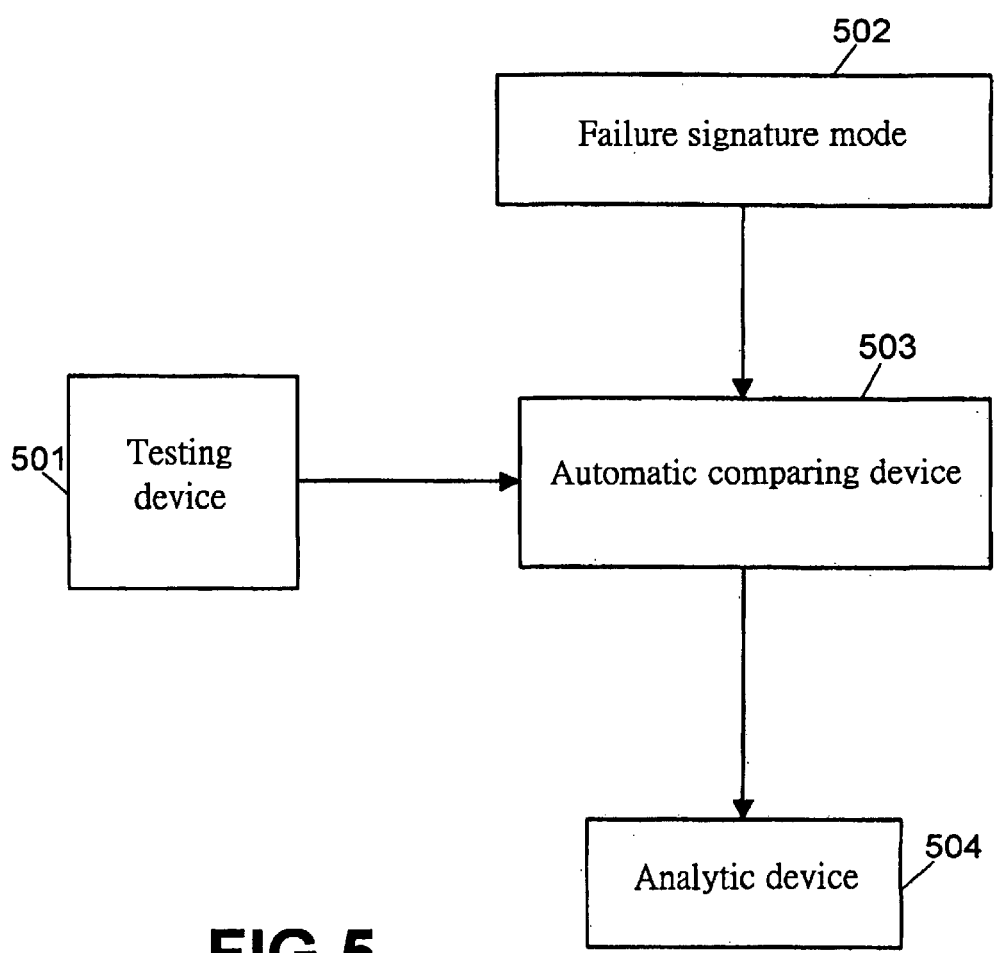
FIG. 5 shows an apparatus relation diagram in accordance with the present invention.

An apparatus diagram implementing the present invention is shown in FIG. 5. A testing device 501 tests at least one selected wafer, and then the test result including the locations of faulty dies and their failure modes 502 is generated for each selected wafer. Then, the test result of each selected wafer with each failure signature data of the failure signature database is compared by an automatic comparing device 503. Then, the wafer numbers and the failure signatures are inputted into an analytic device 504 for further analysis.

Wherein the pattern of the wafer maps 10 conforms to the signatures of GC BUMP, 4 clock and 8 clock. However, the location field and failure modes of dies of GC BUMP completely includes the location field and failure modes of dies of either 4 clock or 8 clock, so GC BUMP is selected as the failure signature, while either 4 clock or 8 clock is the dependent signature. In step 22 as shown in FIG. 2, when compared by the automatic comparing device, if the hit ratio of GC BUMP achieves the value predetermined by the yield-analyzing engineer (preferably 80%) in step 225, only GC BUMP is needed to be compared. Neither 4 clock nor 8 clock needs to be compared to avoid repeated comparison.

Furthermore, the present invention tests at least one selected wafer in step 21 by a testing device, and generates a test result for each wafer. The test result includes wafer numbers, the locations and failure modes of faulty dies.

After testing, in step 22, each test result of the selected wafers is compared with each failure signature data of the failure signature database by an automatic comparing device, and then a comparison result is generated.

In step 22, first the invention sets N=1 in step 220, and then in step 221 the test result is compared with the Nth failure signature data to check whether the failure mode of the test result is included in the failure mode of the Nth failure signature data. If the answer is yes in step 221, step 222 is performed; if the answer is no in step 221, step 229 is performed.

In step 222, the present invention checks whether the position dependent information is Y or N. If the position dependent information is Y, such as the failure signature data 41, 43 and 44, step 223 is performed. If the position dependent information is N, such as the failure signature data 42, step 224 is performed.

If the position dependent information is Y, such as the failure signature data 41, 43 and 44, in step 223 the automatic comparing device compares the location of the faulty dies of the test result with the location field of the faulty dies of the Nth failure signature data. And then the amount of the dies, whose locations are completely the same as described in the location field of the Nth failure signature data, is obtained as n.

In step 223, if n is greater than or equal to 1, it indicates that the location and failure mode of the faulty dies included in the test result are defined by the failure signature database, such as the test result:

| Wafer number | Failure mode | Location of the faulty die (Die number) |
|---|---|---|
| P2A10309.2 | Ya | 0901, 0902 . . . |

Then in step 225, the comparison result of comparing the test result with the failure signature data 41 is:

| Wafer number | Failure signature | Hit ratio % |
|---|---|---|
| P2A10309.2 | GC Bump | 80 |

Wherein, the failure mode (Ya) of the test result is completely included in the failure mode (Ya or Ydcabia) of the failure signature data 41, and the hit ratio is the ratio of n, in which the locations of faulty dies of the test result is completely the same as indicated in the location field of the faulty dies of the failure signature data (for example 40 dies), to M, which is the amount of all faulty dies of failure signature data (for example 50 dies), i.e. the hit ratio is 40/50 or 80%.

In step 227, if each n obtained in step 223 is 0, it indicates that the location and failure mode of the faulty dies included in the test result is not defined by the failure signature database, such as the case of continuous failure of locations of dies in FIG. 3. The following shows a comparison result indicating an unknown signature:

| Wafer number | Failure signature | Hit ratio % |
|---|---|---|
| P2A15061.18 | OTHER 1 | Continuous 20 dies |

Wherein, the comparison result generates an OTHER 1 in the failure signature column and a description with respect to how many continuous dies are faulty in the hit ratio column. The description related to the failure dies is generated by an automatic comparing device to be inputted into an analyzing device in step 27 for further analysis. Moreover, the description is provided to the yield-analyzing engineer for further defining the OTHER 1 in step 23, and then in step 24 the description is inputted into the database as a defined failure signature.

If the position dependence information is N, such as described in the failure signature data 42, the automatic comparing device counts the amount of the faulty dies of the test result in step 224, and obtains the amount as n.

In step 224, if n is greater than or equal to 1, it indicates that the test result is defined by the failure signature database, such as the following test result:

| Wafer number | Failure mode | Location of the faulty die (Die number) |
|---|---|---|
| P2A11317.1 | Ya | 1200, 1201, 1203 . . . |

In step 225, the comparison result of the test result with respect to the failure signature data 42 is:

| Wafer number | Failure signature | Hit ratio % |
|---|---|---|
| P2A11317.1 | Ya scrach | 50 |

Wherein, the failure mode (Ya) of the test result is completely included in the failure mode (Ya) of the failure signature data 42, and the hit ratio is the ratio of the amount of the faulty dies of the test result n (for example 20 dies) to the amount of the faulty dies of the failure signature data M (for example 40 dies), i.e. the hit ratio is 20/40 or 50%.

In step 227, if each n obtained in step 224 is 0, it indicates that the test result is not defined by the failure signature database, and then the comparison result indicating the unknown signature corresponding to each selected wafer is generated in step 228.

In a preferable embodiment after compared by the automatic comparing device, a comprehensive table of the comparison result including the unknown signature (step 228) and the comparison result indicating hit ratio with the defined failure signature data may be generated, for example:

| Wafer number | Failure signature | Hit ratio % |
|---|---|---|
| P2A10106.5 | P1 | 60 |
| P2A10106.5 | P42 | 50 |
| P2A10308.5 | YA Scrach | 72 |
| P2A10309.2 | GC Bump | 95 |
| P2A12399.7 | DC 8 clock | 95 |
| P2A08990.8 | DT etch | 95 |
| P2A10406.1 | P41 | 90 |
| P2A10034.7 | Smear III | 100 |
| P2A12900.7 | DC 8 clock | 95 |
| P2A12345.9 | DT etch | 95 |
| P2A10456.1 | Smear III | 100 |
| P2A10345.1 | 4 Clock | 100 |
| P2A10023.6 | P39 | 30 |
| P2A10023.3 | 4 Clock | 100 |
| P2A12349.1 | 4 Clock | 100 |
| P2A15061.18 | OTHER 1 | Continuous 20 dies |
| P2A10478.10 | OTHER 2 | Continuous 15 dies |

After the aforementioned table of compare results is generated, a threshold is then set in step 25 by the yield-analyzing engineer based on his experience. One or more thresholds may be set as required in order to be compared with the hit ratio of the comparison result of each selected wafer. For example, compare the threshold with the aforementioned comparison result.

When threshold=100,

| Failure signature | Wafer number |
|---|---|
| 4 clock | P2A12345.1 |
| | P2A10023.3 |
| | P2A12349.1 |
| Smear III | P2A10034.7 |
| | P2A10456.1 |

When threshold=95,

| Failure signature | Wafer number |
|---|---|
| GC Bump | P2A10309.2 |
| DC 8 clock | P2A12399.7 |
| | P2A12900.7 |
| DT etch | P2A08990.8 |
| | P2A12345.9 |

Next in step 26, wafer numbers and failure signatures of the wafers with hit ratios greater than or equal to the threshold is picked. In step 27, each picked wafer number and failure signature are inputted in an analytic device for further analyzing. For example, if threshold=100 is set, the wafer numbers conforming to the failure signature 4 clock are P2A12345.1, P2A12349.1. and P2A12349.1. Moreover, these wafer numbers, used to indicate the wafers including 4 clock failure signature, may be inputted into the analytic device for further analyzing the root cause of failure and debugging.

Besides, in step 27, the yield-analyzing engineer may input the information of P2A15061.18 and P2A10478.10, which includes the unknown signature of OTHER 1 and OTHER 2 respectively, into the analytic device for further analyzing. And in step 23, OTHER 1 and OTHER 2 may be defined, and then be inputted into the database in step 24 as a new failure signature data which is built up in step 20.

It will be understood that certain features and sub-combinations are of utility and may be employed without reference to other features and sub-combinations as they are outlined within the claims. While the preferred embodiment and application of the invention has been described, it is apparent to those skilled in the art that the objects and features of the present invention are only limited as set forth in claims attached hereto.

What is claimed is:

1. A method of wafer failure signature identification, the method comprising:
    (a) building up a failure signature database, recording a plurality of failure signature data, each failure signature data including a failure signature, a location field for the faulty dies, a failure mode, a position dependence information and a dependent signature, wherein the position dependence information indicating if the failure signature is related to the location of the faulty dies;
    (b) testing a selected wafer and generating a test result including the location and the failure mode of the selected wafer, wherein the wafer has a wafer number; and
    (c) generating a comparison result by comparing the failure mode of the test result with the failure mode of each failure signature data by an automatic comparing means, wherein the comparison result includes a hit or a miss, and when the comparison result is a hit, the comparison result further includes a hit ratio, the wafer number and the failure signature,
    wherein as the hit ratio of the failure signature data exceeds a predetermined value, the step of comparing the dependent signature of the failure signature database is skipped.

2. The method of claim 1, wherein as the failure signature is related to the location, value of the position dependence information is Y, as the failure signature is not related to the location, value of the position dependence information is N, and the amount of the faulty dies counted based on the location of the failure signature data is denoted as M, wherein M is a natural number.

3. The method of claim 2, wherein in step (c), as value of the position dependence information is Y, the methods further comprising:
    (d) comparing the location of the faulty dies in the test result with the location of the faulty dies in the failure signature data to obtain the number of faulty dies, denoted as n, completely matching the location of the faulty dies in the failure signature data, and n is an integer greater than or equal to 0.

4. The method of claim 3, wherein the hit ratio is n divided by M.

5. The method of claim 4, further comprising:
    (e) selecting a threshold;
    (f) comparing the threshold with the hit ratio;
    (g) selecting the wafer numbers and the failure signatures with hit ratios greater than or equal to the threshold; and
    (h) inputting the wafer numbers and the failure signatures into an analytic means for further analysis.

6. The method of claim 5, wherein as the hit ratio is 0, the comparison result includes an unknown signature defined by the automatic comparing means and a description of the unknown signature, wherein the unknown signature is made the failure signature of the selected wafer.

7. The method of claim 6, further comprising:
    (i) inputting the unknown signature and the description of the unknown signature into the analytic means for further analyzing.

8. The method of claim 7, further comprising:
    (j) defining the unknown signature; and
    (k) inputting the unknown signature into the failure signature database as a new failure signature.

9. The method of claim 1, wherein in step (c), the hit is asserted when the failure mode of the test result is included in the failure mode of the failure signature data.

10. The method of claim 1, wherein the predetermined value is 80%.

* * * * *